United States Patent
Goren et al.

(10) Patent No.: US 6,734,734 B2
(45) Date of Patent: May 11, 2004

(54) AMPLIFIER PHASE DROOP AND PHASE NOISE SYSTEMS AND METHODS

(75) Inventors: Yehuda G. Goren, Palo Alto, CA (US); Charles E. Jensen, Carmichael, CA (US); Philip M. Lally, Palo Alto, CA (US); Donald R. Gagne, Placerville, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 0 days.

(21) Appl. No.: 10/201,801

(22) Filed: Jul. 24, 2002

(65) Prior Publication Data

US 2004/0017255 A1 Jan. 29, 2004

(51) Int. Cl.[7] .................................. H03F 1/26
(52) U.S. Cl. .......................... 330/149; 330/43
(58) Field of Search ................ 330/149, 43, 129, 330/136; 327/362, 317

(56) References Cited

U.S. PATENT DOCUMENTS

| | | |
|---|---|---|
| 3,119,969 A | 1/1964 | Cayzac et al. ............... 330/47 |
| 3,716,745 A | 2/1973 | Phillips ........................ 330/43 |
| 3,796,965 A * | 3/1974 | Quesinberry et al. ......... 330/43 |
| 3,900,823 A | 8/1975 | Sokal et al. ................ 330/149 |
| 4,000,471 A * | 12/1976 | Pankow ....................... 327/317 |
| 4,134,114 A | 1/1979 | Riggs et al. |
| 4,197,540 A | 4/1980 | Riggs et al. ................ 342/201 |
| 4,233,539 A | 11/1980 | Falce ......................... 313/106 |
| 4,267,516 A | 5/1981 | Traa ........................... 330/149 |
| 4,600,892 A | 7/1986 | Wagner et al. ............... 330/144 |
| 4,701,717 A | 10/1987 | Radermacher et al. ...... 330/149 |
| 5,148,117 A | 9/1992 | Talwar ........................ 330/158 |
| 5,182,524 A | 1/1993 | Hopkins ..................... 330/149 |
| 5,438,686 A | 8/1995 | Gehri et al. ................. 455/102 |
| 5,500,621 A | 3/1996 | Katz et al. .................... 330/43 |
| 5,576,660 A | 11/1996 | Pouysegur et al. ......... 330/149 |
| 5,608,331 A | 3/1997 | Newberg et al. ............ 324/613 |
| 5,705,959 A | 1/1998 | O'Loughlin ................ 332/151 |
| 5,742,204 A | 4/1998 | Bell ............................... 330/2 |
| 5,760,646 A | 6/1998 | Belcher et al. ............. 330/149 |
| 5,761,317 A | 6/1998 | Pritchard .................... 330/142 |
| 5,796,211 A | 8/1998 | Graebner et al. ............ 315/3.5 |
| 5,838,195 A | 11/1998 | Szmurlo et al. ............ 336/149 |
| 5,861,777 A | 1/1999 | Sigmon et al. ............. 330/136 |
| 5,915,213 A | 6/1999 | Iwatsuki et al. ............ 455/116 |
| 5,930,688 A | 7/1999 | Floyd et al. ................ 455/116 |
| 5,940,025 A | 8/1999 | Koehnke et al. ............ 342/159 |
| 5,982,233 A | 11/1999 | Hellmark et al. ........... 330/149 |
| 5,990,735 A | 11/1999 | Sigmon et al. ............... 330/10 |
| 6,024,618 A | 2/2000 | Makishima et al. ........... 445/6 |
| 6,177,836 B1 | 1/2001 | Young et al. ................. 330/43 |
| 6,285,254 B1 | 9/2001 | Chen et al. ................... 330/43 |
| 6,459,337 B1 | 10/2002 | Goren et al. .................. 330/43 |
| 2002/0093379 A1 | 7/2002 | Goren et al. |

FOREIGN PATENT DOCUMENTS

DE 3438382 A1 4/1986

OTHER PUBLICATIONS

G.S.V.S. Mallikarjuna Rao, Syed Naveen Altaf A., and A. T. Kalghatgi, "Feedforward Correction Reduces IMD In Broadcast Amplifiers," Microwaves & RF, Jun. 1998, pp. 71–74.

Kathleen Muhonen and Dr. Mohsen Kavehrad, "Amplifier Linerization for the Local Multipoint Distribution System Application," IEEE Personal, Mobile, Indoor and Radio Communication Conference, Boston, Massachusetts, Sep. 1998.

* cited by examiner

*Primary Examiner*—Dinh T Le
(74) *Attorney, Agent, or Firm*—Kirkpatrick & Lockhart LLP (57) ABSTRACT

A system includes a component having a signal input and a power supply input, wherein the power supply input is in communication with a power supply. The system also includes a voltage probe connected between the power supply input and the signal input, wherein the probe injects a compensating signal into the signal input to compensate for variations in an output signal of the power supply over time.

26 Claims, 5 Drawing Sheets

AMPLIFIER PHASE DROOP AND PHASE NOISE SYSTEMS AND METHODS

BACKGROUND

Amplifiers come in many forms and are used in many applications. For example, amplifiers may be used with digital or analog signals, may be used in communications systems such as wireless telecommunications and satellite communications systems, and may be semiconductor-based or vacuum tube-based.

The performance demanded of amplifiers continues to increase, and many conventional amplifiers are failing to keep pace. For example, conventional semiconductor microwave amplifiers lack the power capabilities required by many modern microwave systems. As a result, vacuum tube power amplifiers, such as traveling wave tube amplifiers, are essential components of many modern microwave systems, including telecommunications, radar, electronic warfare, and navigation systems, because microwave tube amplifiers can provide microwave energy at levels of power higher by orders of magnitude in comparison to semiconductor microwave amplifiers. The higher power levels offered by tube devices are facilitated by the fact that electrons can travel at a much higher velocity in a vacuum than in a semiconductor. The higher velocity permits use of larger structures with the same transit time. Larger structures, in turn, permit greater power levels.

During operation of, for example, a radar system with a tube amplifier, the voltage supplied to the amplifier drops (or droops) due to the limited energy storage capacity of the power supply system that supplies power to the amplifier. Such a voltage drop may cause a phase shifting of the RF signal that is output from the amplifier. Such phase shifting may lead to, for example, target detection errors. One known solution to this problem is to add large capacitors and electromagnetic interference (EMI) shielding to the power supply. The capacitors may be combined with inductors to create a low pass filter that minimizes the high frequency ripple effect of the power supply. Such a solution often results in large or bulky power supplies. Also, such a solution does not address the issue of low frequency sideband power line induced spurious and low frequency sideband noise.

SUMMARY

In one embodiment, the present invention is directed to a system including a component having a signal input and a power supply input, wherein the power supply input is in communication with a power supply. The system also includes a voltage probe connected between the power supply input and the signal input, wherein the probe injects a compensating signal into the signal input to compensate for variations in an output signal of the power supply over time.

In one embodiment, the present invention is directed to a system. The system includes a component having a signal input, a power supply input, and an electron source, wherein the power supply input is in communication with a power supply. The system also includes a voltage probe connected between the power supply input and the electron source, wherein the probe injects a compensating signal into the signal input to compensate for variations in an output signal of the power supply over time.

In one embodiment, the present invention is directed to a system. The system includes a first component having a signal input, a signal output, and a power supply input, wherein the power supply input is in communication with a first power supply. The system also includes a second component having a signal input and a power supply input, wherein the power supply input is in communication with a second power supply and wherein the signal input is connected to the signal output of the first component. The system further includes a voltage probe connected between the power supply input of the second component and the signal input of the first device, wherein the probe injects a compensating signal into the signal input of the first device to compensate for variations in an output signal of the second power supply over time.

In one embodiment, the present invention is directed to a method of compensating for unwanted phase changes at an output of a device. The method includes sensing a time-varying component of a signal output from a power supply and adding the time-varying component of the signal to an input signal of the device.

In one embodiment, the present invention is directed to an apparatus. The apparatus includes means for sensing a time-varying component of a signal output from a power supply and means for adding the time-varying component of the signal to an input signal of a device; wherein the adding compensates for unwanted phase changes at an output of the device.

BRIEF DESCRIPTION OF THE DRAWINGS

Further advantages of the present invention may be better understood by referring to the following description taken in conjunction with the accompanying drawings, in which.

DESCRIPTION

It is to be understood that the figures and descriptions of the present invention have been simplified to illustrate elements that are relevant for a clear understanding of the present invention, while eliminating, for purposes of clarity, other elements. Those of ordinary skill in the art will recognize, however, that these and other elements may be desirable. However, because such elements are well known in the art, and because they do not facilitate a better understanding of the present invention, a discussion of such elements is not provided herein.

Figure 1:
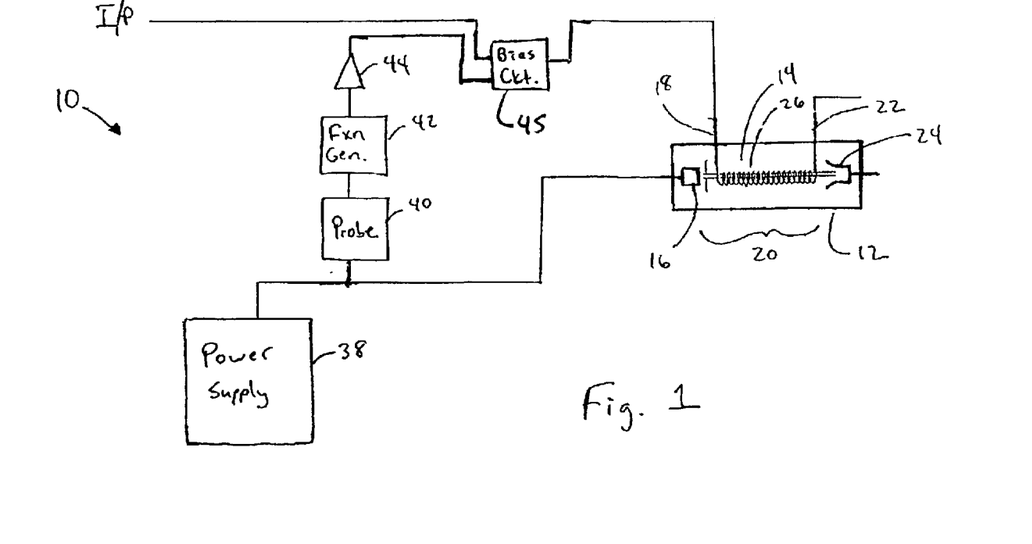
FIG. 1 is a diagram illustrating an amplification system according to one embodiment of the present invention.

FIG. 1 is a diagram illustrating an amplification system 10 according to one embodiment of the present invention. The system 10 includes a vacuum tube device 12 including an evacuated tube 14, a source of electrons 16, an input signal terminal 18 for introducing an input signal, an interaction region 20 where electrons interact with the input signal, and an output signal terminal 22 where an amplified signal emerges from the tube 14. The vacuum tube device 12 may be, for example, a helical traveling wave tube (TWT) with a helix or part of a helix isolated from ground, as illustrated in FIG. 1. A TWT may include a focusing magnet (not shown) to focus the beam of electrons through the interaction region 20, a collector 24 to collect the electron beam after the output microwave power has been generated, and an internal attenuator (not shown) to absorb microwave power reflected back into the tube from mismatches in the output. Although the present invention will be described in the context of a helical TWT, the benefits of the present invention may be realized with other vacuum tube devices such as, for example, coupled cavity devices, and klystrons.

The source of electrons 16 may be, for example, an electron gun. An electron gun is a particular kind of electron source that generates, accelerates, and focuses an electron beam so that the beam follows a desired trajectory after it leaves the electron gun. An electron gun is discussed in more detail hereinbelow with respect to FIG. 2.

The input signal terminal 18 receives an input signal to be amplified by the tube device 12, which may be an amplitude modulated carrier signal. The carrier signal may be, for example, in the microwave frequency range. The carrier signal may be modulated by a data signal, such as a voice data signal having a frequency, for example, in the kHz range, or a video data signal having a frequency, for example, in the MHz range. The carrier signal may also be modulated by other types of data signals. In any event, the frequency of the data signal modulating the carrier signal may be significantly less than the frequency of the carrier signal.

The interactive region 20 is a portion of the tube 12 where the input signal is amplified through interaction with an electron beam. The interaction region 20 may include, for example, a conductive helix 26, as illustrated in FIG. 1, for broadband applications or a coupled-cavity region (not shown) for high-power applications. In the case of a conductive helix 26, for example, the electron beam may pass through the helix 26 while the signal to be amplified is conducted on the helix 26, and inductive interactions occur between the signal and the electrons. The signal modulates the electron beam, and the modulated electron beam amplifies the signal. For the signal to be amplified, the electrons should move along the interaction region 20 at the same speed. If, however, there is a speed deviation between the signal and the electrons which is a function of the power of the signal, phase distortion and some amplitude distortion may occur. Although the helix 26 is illustrated in FIG. 1 as being one helix, it can be understood that the helix 26 may be comprised of multiple non-contiguous helix sections (e.g. an input helix section and an output helix section).

The output signal terminal 22 is the pathway by which the signal leaves the tube device 12. The signal on the output signal terminal 22 is an amplified version of the input signal that entered the tube device 12 at the input signal terminal 18.

Figure 2:
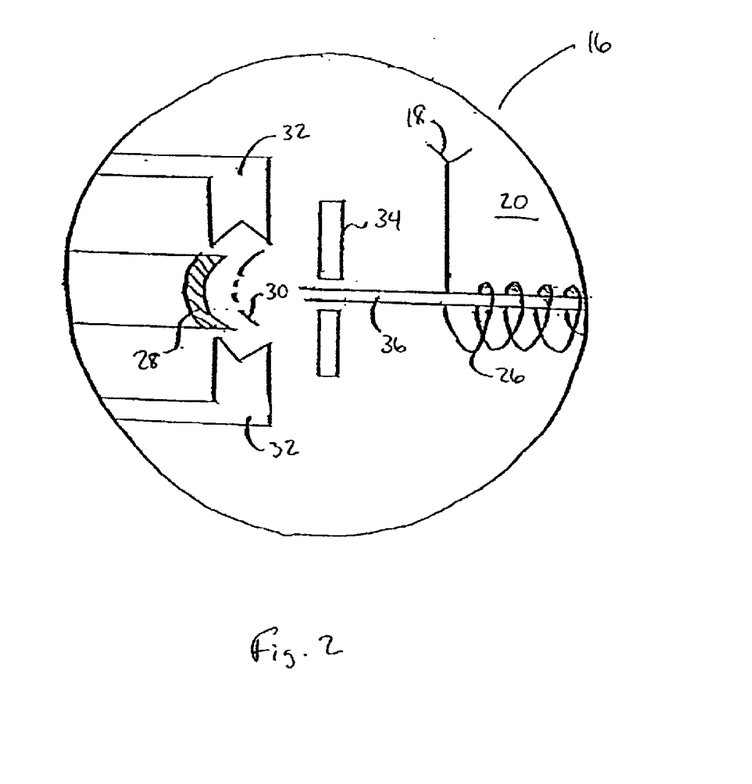
FIG. 2 is a diagram of a source of electrons of the vacuum tube device of FIG. 1 according to one embodiment of the present invention.

FIG. 2 is a diagram of the source of electrons 16 of FIG. 1 in the form of an electron gun according to one embodiment of the present invention. In that embodiment, the source of electrons 16 includes a thermionic cathode 28, one or more grids 30 for inducing emission electrons, focusing electrodes 32 for focusing the electrons into a beam, and an apertured anode 34 for further directing the electron beam 36 into the interaction region 20. The source of electrons 16 produces the electron beam 36. For TWT applications, a long, thin electron beam 36 at a relatively low voltage and high current density may be desirable. Electron guns have many embodiments and variations, such as a planar cathode faced by a planar anode to more elaborate designs such as Pierce guns, conical diode electrodes, concentric cylinders, and spherical cap cathodes. According to one embodiment of the present invention, the electron source 16 may be, for example, any such electron gun.

The cathode 28 introduces the electrons into the tube 12. The cathode 28 may be at a lower voltage relative to the grid(s) 30, the anode 34, and the helix 26. This may be realized, for example, by applying a negative voltage to the cathode 28 such as, for example, −10 kV, and grounding the anode 34. The voltage potential difference between the cathode 28 and the grid(s) may be on the order of 100 V.

The voltage potential difference between the cathode 28 and the anode 34 affects the kinetic energy of the electrons emitted by the cathode 28: the greater the voltage potential difference the greater the kinetic energy of the emitted electrons, and the lesser the voltage potential the lesser the kinetic energy of the electrons. The kinetic energy of the emitted electrons may also be increased by providing a voltage potential difference between the cathode 28 and the interaction region 20 of the tube device 12, such as by modulating the voltage potential difference between the cathode 28 and the helix 26 according to, for example, the serrodyning technique. The number of electrons emitted by the cathode 28, which is proportional to the current of the electron beam 36, is related to the voltage potential difference between the cathode 28 and, for example, the focusing electrodes 32 or the grid(s) 30.

Returning to FIG. 1, the system 10 includes a power supply 38, a probe 40, a function generator 42, an amplifier 44, and a bias circuit 45. The power supply 38 provides a voltage potential to the cathode 28. The power supply 38 may be, for example, a power supply that supplies, as discussed above, −10 kV. The power supply 38 may cause the phase of the output signal of the tube device 12 to droop when, for example, the tube device 12 is employed in a pulsed system, such as a pulsed radar. The phase droop occurs because the amount of energy stored in the capacitive devices of the power supply 38 decreases during each pulse period as the signal is pulsed. Also, the power supply 38 may cause phase noise due to the voltage fluctuation of the power supply 38 combined with the phase pushing characteristics of the tube device 12. Furthermore, spurious modes may be present at the power supply 38 switching frequency and its harmonics and also at the power line frequencies and their harmonics.

The probe 40 may be, for example, an ac voltage probe such as, for example, a capacitor voltage divider. The function generator 42 may be, for example, two operational amplifiers arranged in series. The amplifier 44 may be, for example, a one or two-stage operational amplifier such as, for example, a video amplifier. In operation, the probe 40 detects the time-varying component of the signal from the power supply 38. The signal from the power supply 38 contains voltage droop and voltage ripple information, correction of which may be desirable. The function generator 42 transforms the signal from the probe 40 and the signal is then amplified by the amplifier 44 and biased by the bias circuit 45. The signal is then injected into the input signal to the tube 12.

In various embodiments, the system 10 may include any combination of the presence of the function generator 42 and the amplifier 44. For example, the probe 40 alone may be used without the function generator 42 and the amplifier 44. Such an arrangement would require that the probe 40 is designed (or tuned) to exhibit the desired characteristics in order to compensate for the voltage droop and voltage ripple caused by the power supply 38.

It can be understood that the various components of the system 10, including the power supply 38, the probe 40, the function generator 42 (if present), the amplifier 44 (if present) and the bias circuit 45 may be packaged into a unitary package or may be physically separate, depending on the application.

Figure 3:
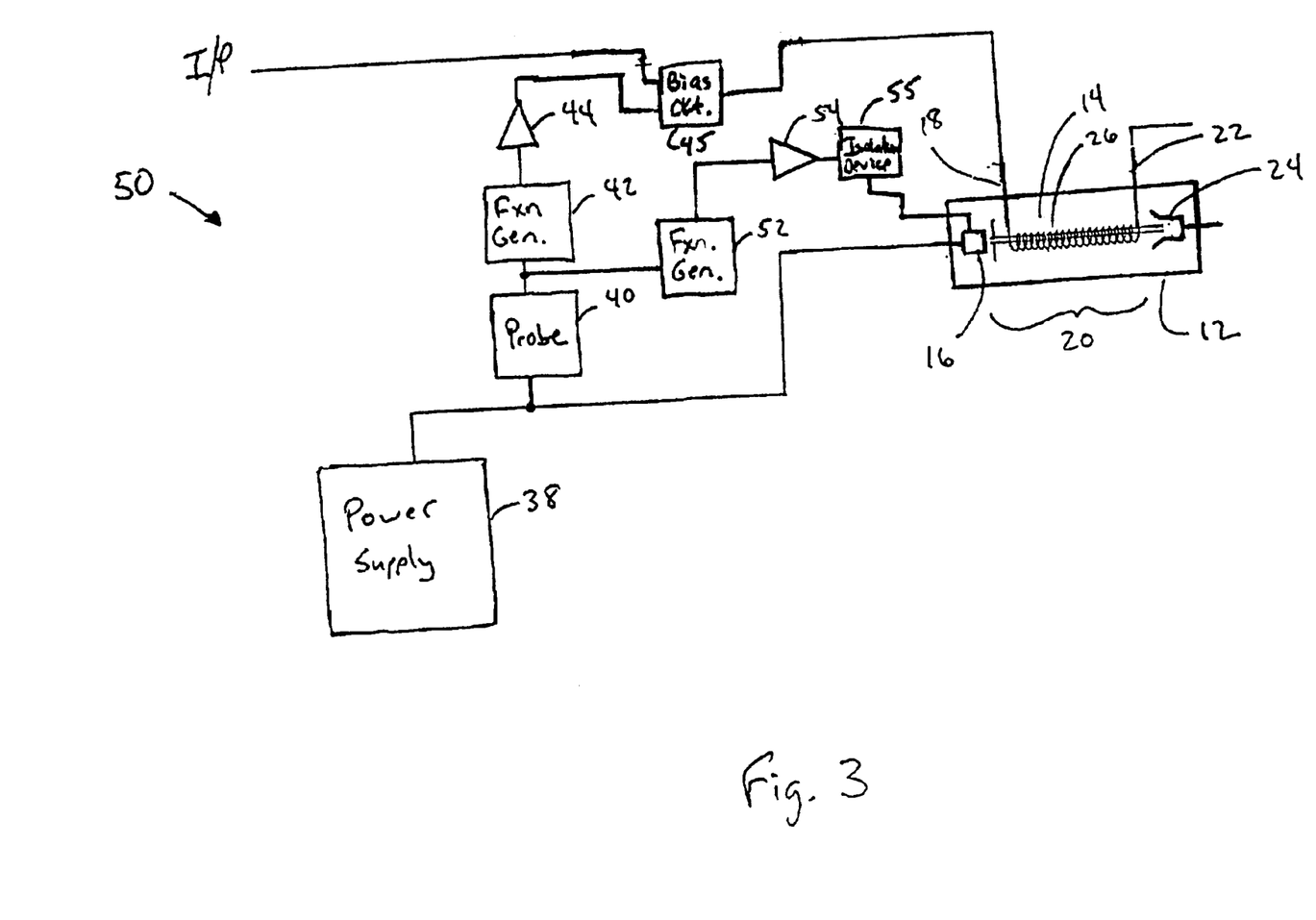
FIG. 3 is a diagram illustrating an amplification system according to one embodiment of the present invention.

FIG. 3 is a diagram illustrating an amplification system 50 according to one embodiment of the present invention. The system 50 is similar to the system 10 as described hereinabove in conjunction with FIG. 1. However, the system 50 includes a second function generator 52, a second amplifier 54, and a coupling, or isolation device 55. The isolation device 55 may be any suitable type of, for example, inductive or capacitive coupling circuit such as, for example, an isolation transformer. In order to further compensate for the voltage droop and voltage ripple of the power supply 38, the function generator 52 and the amplifier 54 transform and amplify the signal, respectively, and the isolation device 55 couples the signal into the grid 30 of the source of electrons 16. Such an arrangement compensates for any amplitude noise caused by the voltage droop and voltage ripple of the power supply 38.

In one embodiment of the system 50, the input signal to the tube 12 is not fed a conditioning signal by omission of the function generator 42, the amplifier 44, and the bias circuit 45. Such an embodiment would compensate for amplitude noise but not phase noise. Also, in various embodiments, the system 50 may include any combination of the presence or absence of the function generator 52 and the amplifier 54.

Figure 4:
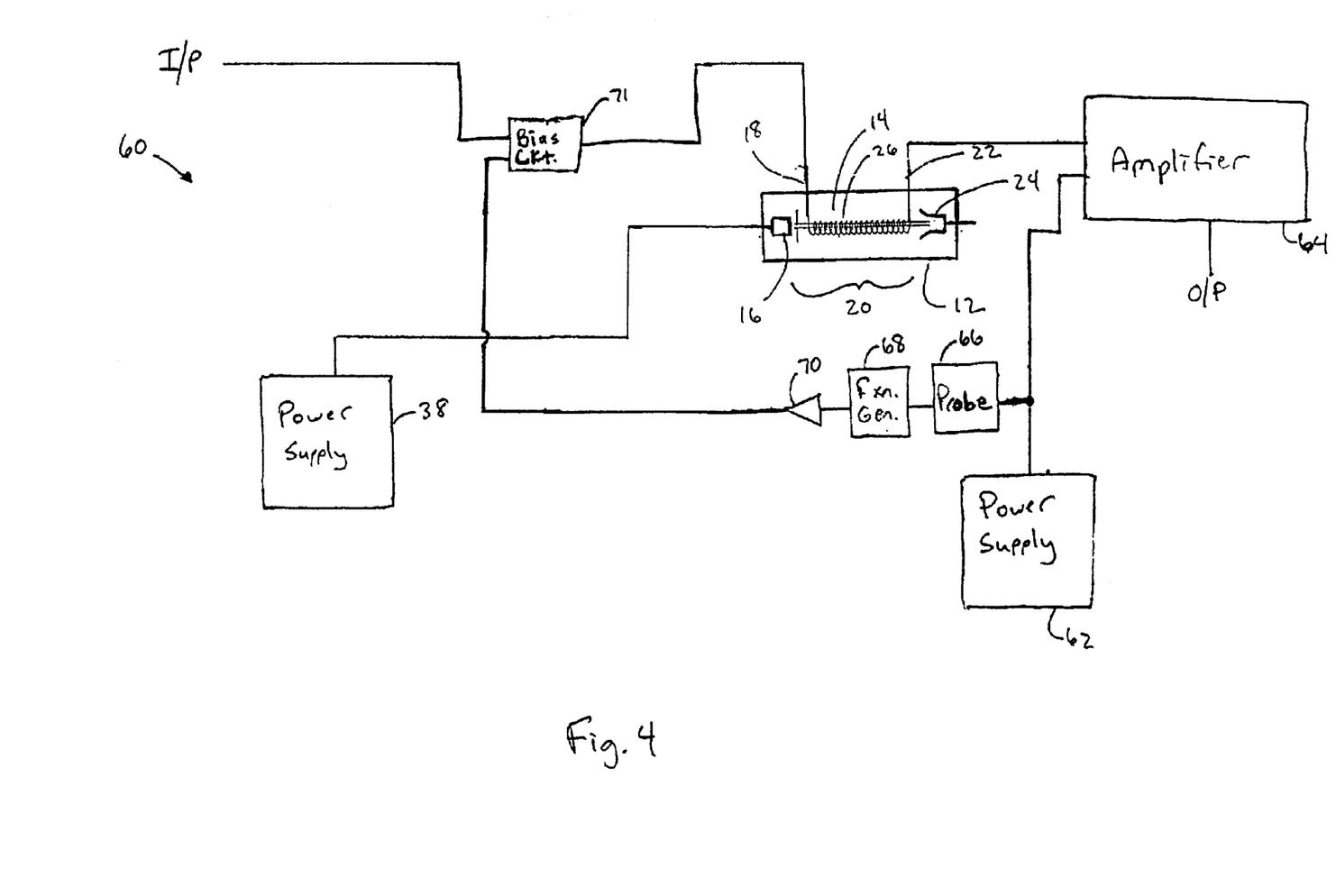
FIG. 4 is a diagram illustrating a cascaded amplification system according to one embodiment of the present invention.

FIG. 4 is a diagram illustrating a cascaded amplification system 60 according to one embodiment of the present invention. In the system 60, a second power supply 62 supplies power to an amplifier 64. The amplifier 64 may be, for example, a noisy amplifier such as, for example, a cross-field amplifier. A voltage probe 66, a function generator 68, an amplifier 70, and a bias circuit 71 are connected between the voltage line of the power supply 62 and the input signal of the tube 12.

The probe 66 may be, for example, an ac voltage probe such as, for example, a capacitor voltage divider. The function generator 68 may be, for example, two operational amplifiers arranged in series. The amplifier 70 may be, for example, a one or two-stage operational amplifier such as, for example, a video amplifier. In operation, the probe 66 detects the time-varying component of the signal from the power supply 62. The signal from the power supply 62 contains voltage droop and voltage ripple information, correction of which may be desirable. The function generator 68 transforms the signal from the probe 66 and the signal is then amplified by the amplifier 70 and biased by the bias circuit 71. The signal is then injected into the input signal to the tube 12. The system 60 thus compensates for the noise of the amplifier 64 to minimize, for example, phase droop at the output of the amplifier 64.

In various embodiments, the system 60 may include any combination of the presence of the function generator 68 and the amplifier 70.

Figure 5:
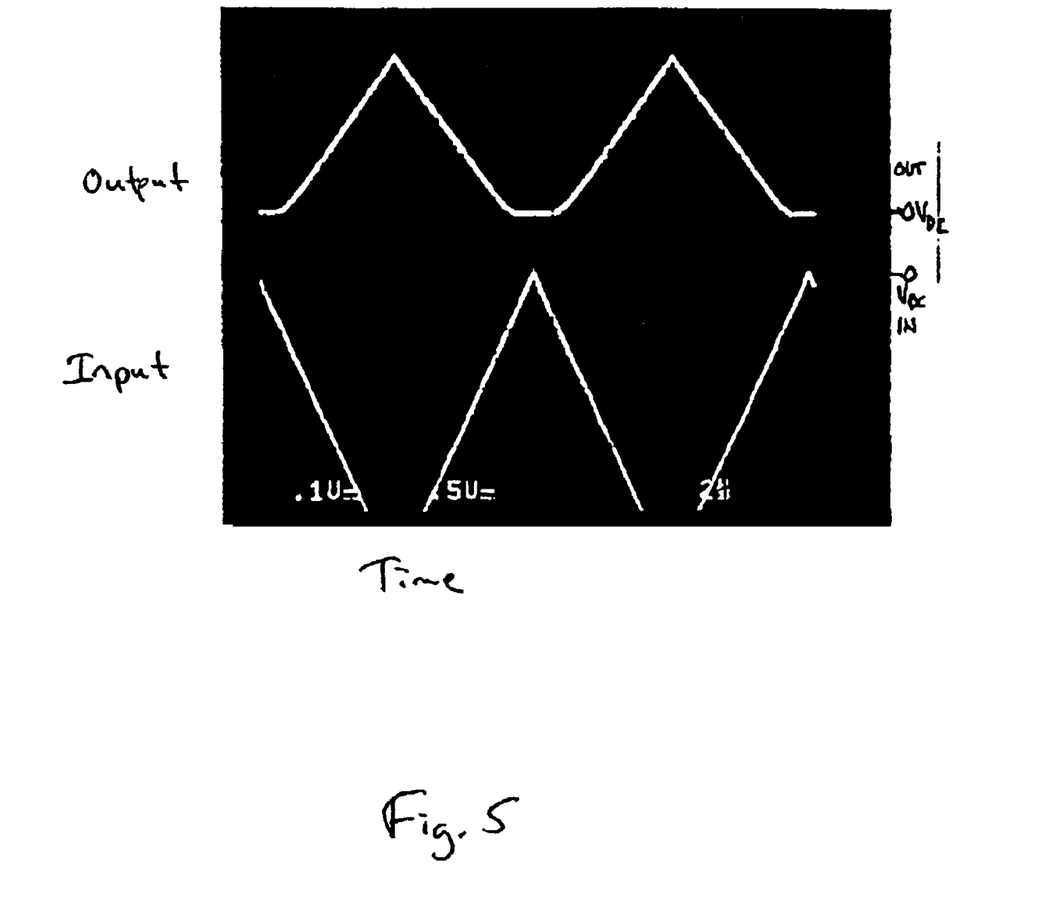
FIG. 5 is a diagram illustrating sample input and output waveforms for the function generator of the systems of the present invention according to one embodiment of the present invention.

FIG. 5 is a diagram illustrating sample input and output waveforms for the function generator 42 of the systems of the present invention according to one embodiment of the present invention. The input waveform is input from the probe 40 and the output waveform is output from the function generator 42 which, in the embodiment illustrated in FIG. 5, is two op amps arranged in series. The op amps were 100 mA, 100 MHz current feedback amplifiers sold by National Semiconductor under Part No. LM6181 tuned with a 4 V dc adjust on the first op amp in the series.

Figure 6:
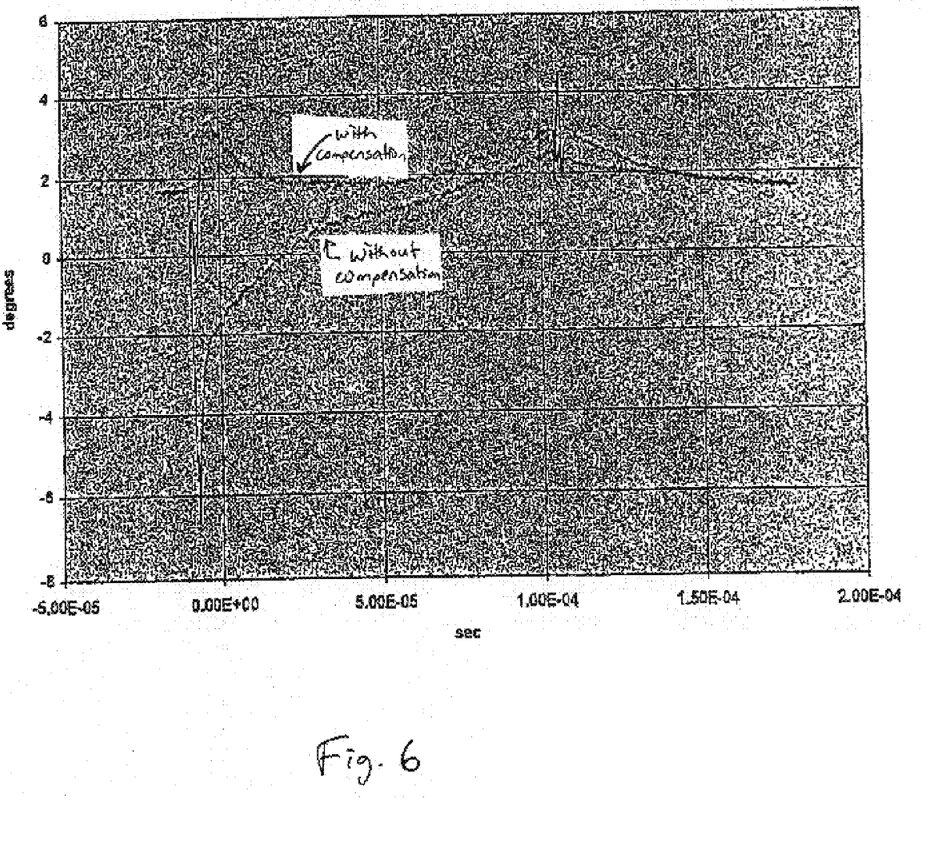
FIG. 6 is a diagram illustrating experimental results of an implementation of an embodiment of the present invention.

FIG. 6 is a diagram illustrating experimental results of an implementation of an embodiment of the present invention. The implemented embodiment included a probe and an amplifier connected between the voltage line of a power supply and the helix input to a 1 kW S band radar amplifier. As can be seen in FIG. 6, the uncompensated phase droop of approximately 7 degrees was reduced to a small ripple of approximately ±0.5 of one degree over a 100 microsecond pulse length by utilizing the techniques of the present invention. Also, the overall amplifier phase noise was reduced by approximately 7 dB up to 200 kHz above the carrier where it merged with the instrumentation noise floor.

While several embodiments of the invention have been described, it should be apparent, however, that various modifications, alterations and adaptations to those embodiments may occur to persons skilled in the art with the attainment of some or all of the advantages of the present invention. It is therefore intended to cover all such modifications, alterations and adaptations without departing from the scope and spirit of the present invention as defined by the appended claims.

What is claimed is:

1. A system, comprising:
    a component having a signal input a signal output, and a power supply input, wherein the power supply input is in communication with a power supply; and
    a voltage probe connected between the power supply input and the signal input, wherein the probe detects a time-varying component of an output signal of the power supply and injects a compensating signal into the signal input to compensate for variations in the output signal of the power supply over time.

2. The system of claim 1, further comprising a function generator connected between the voltage probe and the signal input.

3. The system of claim 1, further comprising an amplifier connected between the voltage probe and the signal input.

4. The system of claim 1, wherein the component includes an amplifier.

5. The system of claim 1, wherein the component includes a traveling wave tube amplifier.

6. The system of claim 3, wherein the amplifier includes an operational amplifier.

7. The system of claim 2, wherein the function generator includes an operational amplifier.

8. The system of claim 1, further comprising a bias circuit connected between the voltage probe and the signal input.

9. A system, comprising:
    a component having a signal input, a signal output, a power supply input, and an electron source, wherein the power supply input is in communication with a power supply; and
    a voltage probe connected between the power supply input and the electron source, wherein the probe detects a time-varying component of an output signal of the power supply and injects a compensating signal into the signal input to compensate for variations in the output signal of the power supply over time.

10. The system of claim 9, further comprising a function generator connected between the voltage probe and the electron source.

11. The system of claim 9, further comprising an amplifier connected between the voltage probe and the electron source.

12. The system of claim 9, further comprising a function generator connected between the voltage probe and the signal input.

13. The system of claim 9, further comprising an amplifier connected between the voltage probe and the signal input.

14. The system of claim 9, wherein the component includes a traveling wave tube amplifier.

15. The system of claim 9, further comprising an isolation device connected between the voltage probe and the electron source.

16. A system, comprising:
   a first component having a signal input, a signal output, and a power supply input, wherein the power supply input is in communication with a first power supply;
   a second component having a signal input, a signal output, and a power supply input, wherein the power supply input is in communication with a second power supply and wherein the signal input is connected to the signal output of the first component; and
   a voltage probe connected between the power supply input of the second component and the signal input of the first device, wherein the probe detects a time-varying component of an output signal of the power supply and injects a compensating signal into the signal input of the first device to compensate for variations in the output signal of the second power supply over time.

17. The system of claim 16, wherein one of the first and the second components is a traveling wave tube amplifier.

18. The system of claim 16, further comprising a function generator connected between the voltage probe and the signal input of the first device.

19. The system of claim 16, further comprising an amplifier connected between the voltage probe and the signal input of the first device.

20. The system of claim 16, further comprising a bias circuit connected between the voltage probe and the signal input of the first device.

21. A method of compensating for unwanted phase changes at an output of a device, the method comprising:
   sensing a time-varying component of a signal output from a power supply; and
   adding the time-varying component of the signal to an input signal of the device.

22. The method of claim 21, further comprising amplifying the time-varying component of the signal.

23. The method of claim 21, further comprising transforming the time-varying component of the signal.

24. An apparatus, comprising:
   means for sensing a time-varying component of a signal output from a power supply and
   means for adding the time-varying component of the signal to an input signal of a device; wherein the adding compensates for unwanted phase changes at an output of the device.

25. The apparatus of claim 24, further comprising means for amplifying the time-varying component of the signal.

26. The apparatus of claim 24, further comprising means for transforming the time-varying component of the signal.

* * * * *

UNITED STATES PATENT AND TRADEMARK OFFICE
CERTIFICATE OF CORRECTION

PATENT NO. : 6,734,734 B2
APPLICATION NO. : 10/201801
DATED : May 11, 2004
INVENTOR(S) : Goren et al.

It is certified that error appears in the above-identified patent and that said Letters Patent is hereby corrected as shown below:

Title page should be deleted and substitute the attached title page.

In the Drawings, replace drawing sheets 1-5, consisting of Figures 1-6, with replacement drawing sheets 1-5, consisting of Figures 1-6, submitted concurrently with payment of the issue fee.

Column 3, line 63, add --of-- after --emission--.

Column 4, line 15, add --30-- after --grid(s)--.

Column 4, line 66, add --or absence-- after --presence--.

Column 5, line 63, add --or absence-- after --presence--.

Column 6, line 30, add --,-- after --input--.

Column 8, line 21, add --;-- after --supply--.

Signed and Sealed this

Thirteenth Day of April, 2010

David J. Kappos
*Director of the United States Patent and Trademark Office*

United States Patent
Goren et al.

(10) Patent No.: US 6,734,734 B2
(45) Date of Patent: May 11, 2004

(54) AMPLIFIER PHASE DROOP AND PHASE NOISE SYSTEMS AND METHODS

(75) Inventors: Yehuda G. Goren, Palo Alto, CA (US); Charles E. Jensen, Carmichael, CA (US); Philip M. Lally, Palo Alto, CA (US); Donald R. Gagne, Placerville, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 0 days.

(21) Appl. No.: 10/201,801

(22) Filed: Jul. 24, 2002

(65) Prior Publication Data

US 2004/0017255 A1 Jan. 29, 2004

(51) Int. Cl.[7] .............................................. H03F 1/26
(52) U.S. Cl. ................................... 330/149; 330/43
(58) Field of Search .................... 330/149, 43, 129, 330/136; 327/362, 317

(56) References Cited

U.S. PATENT DOCUMENTS

| | | | |
|---|---|---|---|
| 3,119,969 A | 1/1964 | Cayzac et al. | 330/47 |
| 3,716,745 A | 2/1973 | Phillips | 330/43 |
| 3,796,965 A | * 3/1974 | Quesinberry et al. | 330/43 |
| 3,900,823 A | 8/1975 | Sokal et al. | 330/149 |
| 4,000,471 A | * 12/1976 | Pankow | 327/317 |
| 4,134,114 A | 1/1979 | Riggs et al. | |
| 4,197,540 A | 4/1980 | Riggs et al. | 342/201 |
| 4,233,539 A | 11/1980 | Falce | 313/106 |
| 4,267,516 A | 5/1981 | Traa | 330/149 |
| 4,600,892 A | 7/1986 | Wagner et al. | 330/144 |
| 4,701,717 A | 10/1987 | Radermacher et al. | 330/149 |
| 5,148,117 A | 9/1992 | Talwar | 330/158 |
| 5,182,524 A | 1/1993 | Hopkins | 330/149 |
| 5,438,686 A | 8/1995 | Gehri et al. | 455/102 |
| 5,500,621 A | 3/1996 | Katz et al. | 330/43 |
| 5,576,660 A | 11/1996 | Pouysegur et al. | 330/149 |
| 5,608,331 A | 3/1997 | Newberg et al. | 324/613 |
| 5,705,959 A | 1/1998 | O'Loughlin | 332/151 |
| 5,742,204 A | 4/1998 | Bell | 330/2 |
| 5,760,646 A | 6/1998 | Belcher et al. | 330/149 |
| 5,761,317 A | 6/1998 | Pritchard | 330/142 |
| 5,796,211 A | 8/1998 | Graebner et al. | 315/3.5 |
| 5,838,195 A | 11/1998 | Szmurlo et al. | 336/149 |
| 5,861,777 A | 1/1999 | Sigmon et al. | 330/136 |
| 5,915,213 A | 6/1999 | Iwatsuki et al. | 455/116 |
| 5,930,688 A | 7/1999 | Floyd et al. | 455/116 |
| 5,940,025 A | 8/1999 | Koehnke et al. | 342/159 |
| 5,982,233 A | 11/1999 | Hellmark et al. | 330/149 |
| 5,990,735 A | 11/1999 | Sigmon et al. | 330/10 |
| 6,024,618 A | 2/2000 | Makishima et al. | 445/6 |
| 6,177,836 B1 | 1/2001 | Young et al. | 330/43 |
| 6,285,254 B1 | 9/2001 | Chen et al. | 330/43 |
| 6,459,337 B1 | 10/2002 | Goren et al. | 330/43 |
| 2002/0093379 A1 | 7/2002 | Goren et al. | |

FOREIGN PATENT DOCUMENTS

DE 3438382 A1 4/1986

OTHER PUBLICATIONS

G.S.V.S. Mallikarjuna Rao, Syed Naveen Altaf A., and A. T. Kalghatgi, "Feedforward Correction Reduces IMD In Broadcast Amplifiers," Microwaves & RF, Jun. 1998, pp. 71–74.

Kathleen Muhonen and Dr. Mohsen Kavehrad, "Amplifier Linerization for the Local Multipoint Distribution System Application," IEEE Personal, Mobile, Indoor and Radio Communication Conference, Boston, Massachusetts, Sep. 1998.

* cited by examiner

*Primary Examiner*—Dinh T Le
(74) *Attorney, Agent, or Firm*—Kirkpatrick & Lockhart LLP (57) ABSTRACT

A system includes a component having a signal input and a power supply input, wherein the power supply input is in communication with a power supply. The system also includes a voltage probe connected between the power supply input and the signal input, wherein the probe injects a compensating signal into the signal input to compensate for variations in an output signal of the power supply over time.

26 Claims, 5 Drawing Sheets